United States Patent
Bartling et al.

(10) Patent No.: US 9,590,649 B2
(45) Date of Patent: Mar. 7, 2017

(54) ANALOG-TO-DIGITAL CONVERSION WITH MICRO-CODED SEQUENCER

(71) Applicant: Microchip Technology Incorporated, Chandler, AZ (US)

(72) Inventors: James E. Bartling, Chandler, AZ (US); Igor Wojewoda, Tempe, AZ (US); Kevin Kilzer, Chandler, AZ (US)

(73) Assignee: MICROCHIP TECHNOLOGY INCORPORATED, Chandler, AZ (US)

( * ) Notice: Subject to any disclaimer, the term of this patent is extended or adjusted under 35 U.S.C. 154(b) by 0 days.

(21) Appl. No.: 14/883,842

(22) Filed: Oct. 15, 2015

(65) Prior Publication Data

US 2016/0112060 A1 Apr. 21, 2016

Related U.S. Application Data

(60) Provisional application No. 62/065,129, filed on Oct. 17, 2014.

(51) Int. Cl.
*H03M 1/12* (2006.01)
*H03K 17/96* (2006.01)
(Continued)

(52) U.S. Cl.
CPC ............... *H03M 1/12* (2013.01); *G06F 1/32* (2013.01); *H03K 17/9622* (2013.01);
(Continued)

(58) Field of Classification Search
CPC ......... H03M 1/00; H03M 1/12; H03M 1/1225
(Continued)

(56) References Cited

U.S. PATENT DOCUMENTS 7,460,441 B2   12/2008   Bartling .................. 368/118
7,764,213 B2   7/2010    Bartling et al. ............ 341/152
(Continued)

OTHER PUBLICATIONS

Bohn, Bruce, "AN1250: Microchip CTMU for Capacitive Touch Applications," Microchip Technology Incorporated, 22 pages, Jan. 16, 2009.

(Continued)

*Primary Examiner* — Joseph Lauture
(74) *Attorney, Agent, or Firm* — Slayden Grubert Beard PLLC

(57) ABSTRACT

A micro-coded sequencer controls complex conversion sequences independent of a central processing unit (CPU). Micro-coding provides for easily adding new process steps and/or updating existing process steps. Such a programmable sequencer in combination with an analog-to-digital conversion module such as an analog-to-digital converter (ADC) or a charge time measurement unit (CTMU), and digital processing circuits may be configured to work independently of the CPU in combination with the micro-coded sequencer. Thereby providing self-sufficient operation in low power modes when the CPU and other high power modules are in a low power sleep mode. Such a peripheral can execute data collection and processing thereof, then wake the CPU only when needed, thereby saving power. Furthermore, this peripheral does not require CPU processing so that time critical applications that do require control by the CPU can operate more efficiently and with less operating overhead burden.

21 Claims, 7 Drawing Sheets

(51) Int. Cl.
*G06F 1/32* (2006.01)
*H03M 1/00* (2006.01)
*H03M 1/50* (2006.01)

(52) U.S. Cl.
CPC ............... *H03M 1/1245* (2013.01); *H03K 2217/960725* (2013.01); *H03M 1/00* (2013.01); *H03M 1/1225* (2013.01); *H03M 1/50* (2013.01)

(58) Field of Classification Search
USPC .............................. 341/155, 156, 120, 141
See application file for complete search history.

(56) References Cited

U.S. PATENT DOCUMENTS

| | | | | |
|---|---|---|---|---|
| 2003/0197632 | A1* | 10/2003 | Rubin | G06F 1/30 341/141 |
| 2010/0102832 | A1 | 4/2010 | Bartling et al. | 324/679 |
| 2012/0254803 | A1 | 10/2012 | Grist et al. | 715/832 |
| 2013/0088242 | A1 | 4/2013 | Lundstrum et al. | 324/609 |
| 2013/0121372 | A1* | 5/2013 | Wenn | G01K 7/22 374/102 |

OTHER PUBLICATIONS

Yedamale, Padmaraja et al., "AN1375: See What You Can Do with the CTMU," Microchip Technology Incorporated, 12 pages, Feb. 18, 2011.

Anonymous, "Microsequencer," Wikipedia—the Free Encyclopedia, URL: https://en.wikipedia.org/w/index.php?title=Microsequencer&oldid=599698698, 1 pages, Mar. 15, 2014.

International Search Report and Written Opinion, Application No. PCT/US2015/055874, 16 pages, Feb. 1, 2016.

* cited by examiner

ANALOG-TO-DIGITAL CONVERSION WITH MICRO-CODED SEQUENCER

RELATED PATENT APPLICATION

This application claims priority to commonly owned U.S. Provisional Patent Application No. 62/065,129; filed Oct. 17, 2014; which is hereby incorporated by reference herein for all purposes.

TECHNICAL FIELD

The present disclosure relates to analog-to-digital conversion modules, and, in particular, to analog-to-digital conversion modules in combination with a micro-coded sequencer.

BACKGROUND

Analog-to-digital conversion, in particular analog-to-digital conversion modules embedded in microcontrollers, are typically under software control of the respective central processing unit (CPU) core of the microcontroller. These analog-to-digital conversion modules have limited operation in low power modes such as sleep and idle when the CPU is inactive. In certain applications the analog-to-digital conversion modules require interaction with other microcontroller peripheral functions, e.g., storage registers, accumulators, multiplexers, sample and hold circuits, etc., that require the CPU to control the interaction between the analog-to-digital conversion modules and these other microcontroller peripheral functions. This requirement of the CPU having to control interactions between the analog-to-digital conversion modules and other support peripherals consumes valuable CPU processing power which may be used more productively for example, but not limited to, motor control, switched mode power supply (SMPS) control, digital signal processing (DSP), etc. Also when the CPU is required to perform various tasks, this may increase power consumption of the microcontroller.

Alternatively to CPU control, a hard-coded sequencer in combination with the analog-to-digital conversion module can provide one sequence of steps for a process, e.g., performing an algorithm. However, the steps in a hard-coded sequencer cannot be changed to correct errors or incorporate improvements to the process. Only a single process sequence is available and no other or more steps can be changed or to added to the process. This results in each integrated circuit device possibly ending up being unique as the process steps are tweaked from one integrated circuit device to another during production thereof.

SUMMARY

Hence there is a need for complex process conversion sequences that are independent of CPU involvement and may be changed and updated as needed. Some such process conversion sequences may be, for example but not limited to, capacitive (CAP) touch detection. Complex processes are constantly evolving, so the process conversion sequences need to evolve with them and run at minimum power necessary for the process objective(s).

According to an embodiment, an apparatus for analog-to-digital conversion using a micro-coded sequencer may comprise: means for analog-to-digital conversion; a micro-coded sequencer coupled to and controlling the analog-to-digital conversion means; and a memory coupled to the micro-coded sequencer, wherein the memory stores micro-coded words for instructing the micro-coded sequencer how to control the analog-to-digital conversion means.

According to a further embodiment, the analog-to-digital conversion means may be an analog-to-digital converter (ADC). According to a further embodiment, the analog-to-digital conversion means may be a charge time measurement unit (CTMU). According to a further embodiment, an analog multiplexer may be provided having an output coupled to an input of the analog-to-digital conversion means and may be controlled by the micro-coded sequencer, wherein the analog multiplexer may select inputs thereof that may be determined by the micro-coded words instructing the micro-coded sequencer. According to a further embodiment, an address decoder may be coupled to the memory and may be used to select a micro-coded word for the micro-coded sequencer.

According to a further embodiment, a central processing unit (CPU) may have a low power sleep mode, wherein the micro-coded sequencer, analog-to-digital conversion means and memory function when the CPU may be in the low power sleep mode. According to a further embodiment, the CPU, micro-coded sequencer, analog-to-digital conversion means and the memory may be provide by a microcontroller. According to a further embodiment, the micro-coded sequencer may comprise a data collection sequencer and a math post processor sequencer. According to a further embodiment, a math post processor may be provided, wherein the math post processor may be controlled by the math post processor sequencer. According to a further embodiment, each of the micro-coded words may comprise a data portion and a math post processor portion. According to a further embodiment, a first plurality of micro-coded words controls the data collection sequencer and a second plurality of micro-coded words controls the math post processor sequencer. According to a further embodiment, a first plurality of micro-coded words may control a first sequence of steps and a second plurality of micro-coded words may control a second sequence of steps. According to a further embodiment, the micro-coded word may comprise portions selected from the group consisting of loop control, math calculations control, analog-to-digital conversion control, charge time measurement unit control, and control of external node connections. According to a further embodiment, the micro-coded word may comprise portions selected from the group consisting of end of sequence, threshold control, analog-to-digital conversion latch clock, accumulator latch clock, record control and accumulator control.

According to another embodiment, an analog-to-digital converter peripheral in an integrated circuit device may comprise: an analog-to-digital converter (ADC) core; a state machine controlled by programmable instruction words, wherein the state machine may be performing control functions of the ADC core and may be operable to at least configure external pins of the integrated circuit device, initiate sampling and conversion, store results in a memory, and may perform loop operations; and a memory that may store a sequence of associated instruction words.

According to a further embodiment, an instruction word may comprise bit fields for defining at least one of: a loop, a post processing function, an ADC control function, and an external pin configuration. According to a further embodiment, a capacitive time measurement unit (CTMU) may be provided, wherein the instruction word may comprise a bit field for control of the CTMU. According to a further embodiment, an arithmetic logic unit may be provided that is controllable by at least one post processing instruction word, wherein post processing may be initiated by the state machine instruction word. According to a further embodiment, the post processing instruction word may comprise at least a bit field for controlling a threshold, an accumulator input, and storing of results. According to a further embodiment, a microcontroller may comprise any one or more of the aforementioned analog-to-digital converter peripherals.

BRIEF DESCRIPTION OF THE DRAWINGS

A more complete understanding of the present disclosure may be acquired by referring to the following description taken in conjunction with the accompanying drawings wherein:

FIG. 3 illustrates a register bit assignment diagram for a micro-coded word used to control resources needed for the CVD process, according to a specific example embodiment of this disclosure;

FIG. 6 illustrates a register bit assignment diagram for a micro-coded word used to control resources needed for math post processing, according to a specific example embodiment of this disclosure.

Figure 1:
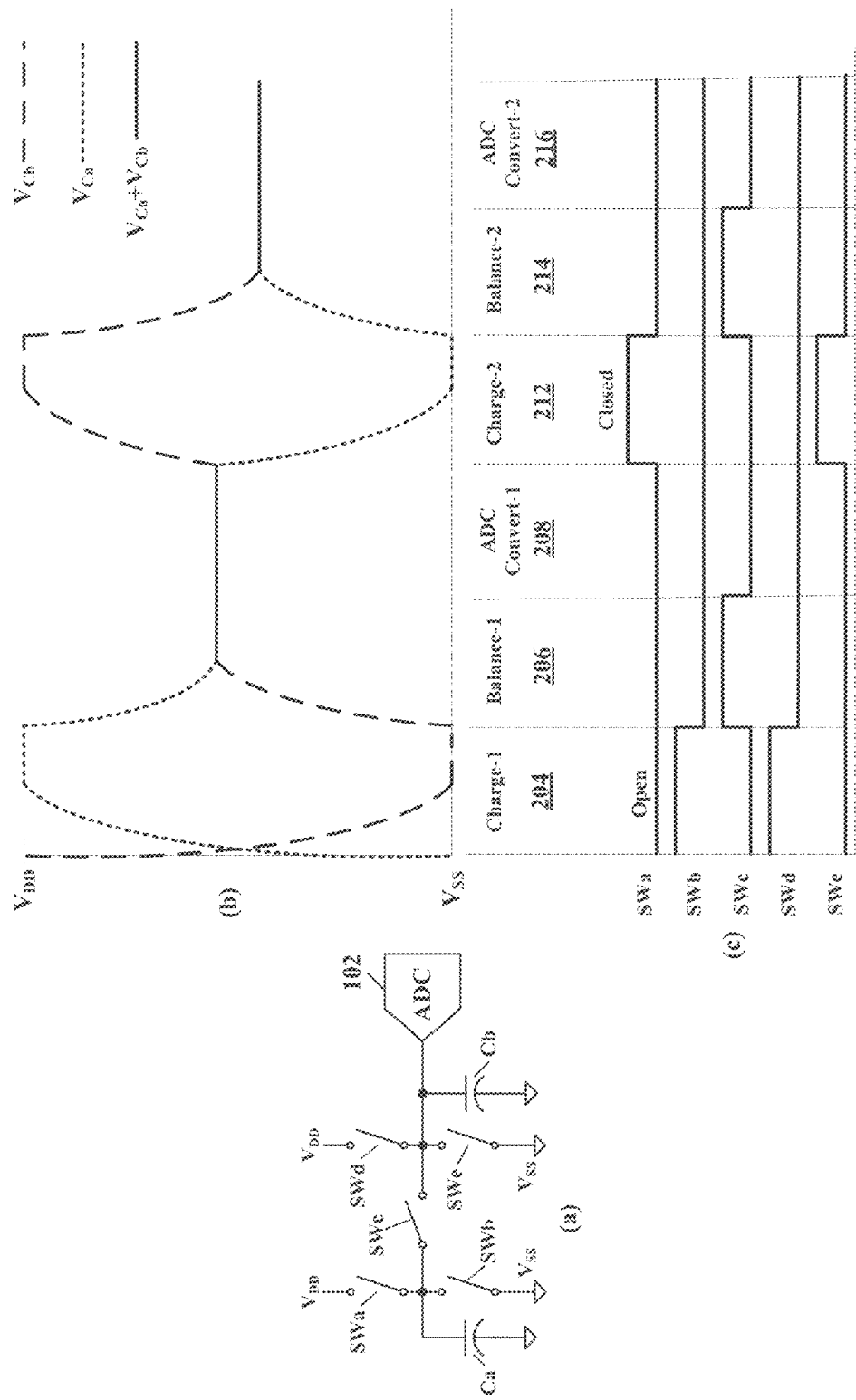
FIG. 1 illustrates a schematic circuit diagram, a schematic graph of a capacitive voltage divider measurement, e.g., for capacitive touch detection; and a switch timing diagram thereof, according to the teachings of this disclosure.

While the present disclosure is susceptible to various modifications and alternative forms, specific example embodiments thereof have been shown in the drawings and are herein described in detail. It should be understood, however, that the description herein of specific example embodiments is not intended to limit the disclosure to the particular forms disclosed herein.

DETAILED DESCRIPTION

According to various embodiments of this disclosure, a micro-coded sequencer may be used to provide complete complex conversion sequences independent of the analog-to-digital conversion and/or central processing unit (CPU) core of an integrated circuit device, such as for example but not limited to, a microcontroller. By making the sequencer micro-coded, new process steps may be added and existing process steps updated.

Such a programmable sequencer in combination with an analog-to-digital conversion module for example, but not limited to, an analog-to-digital converter (ADC) and/or charge time measurement unit (CTMU), and digital processing, e.g., computation, circuits may be configured to work independently of the CPU core. Thus the micro-coded sequencer controlling the analog-to-digital conversion and subsequent digital processing provides for self-sufficient operation in low power modes when the CPU and/or other high power consumption modules are in a low power sleep mode. Such a peripheral can execute data collection and processing thereof, then wake the CPU only when needed, thereby saving power. Furthermore, this peripheral does not require CPU processing so that time critical applications that do require control by the CPU can operate more efficiently and with less operating overhead burden.

It is contemplated and within the scope of this disclosure that the analog voltage of a capacitive voltage divider (CVD) circuit resulting from combining a charged/discharged external capacitance, e.g., touch key, and a discharged/charged internal sample and hold capacitor of an ADC may be converted to a digital representation by any type of ADC or a CTMU that may be used to provide a digital representation of the analog voltage value. The CTMU may be used to either charge or discharge the sample and hold capacitor having the CVD result to a known voltage value and the time (clock count) it takes to get to the known voltage value may be used in determining the CVD voltage value result. Application of a CTMU for providing a digital representation of an analog value is more fully described in Microchip application notes AN1250 and AN1375, available at www.microchip.com, and commonly owned U.S. Pat. No. 7,460,441 B2, entitled "Measuring a long time period;" and U.S. Pat. No. 7,764,213 B2, entitled "Current-time digital-to-analog converter," both by James E. Baffling; wherein all are hereby incorporated by reference herein for all purposes.

A programmable sequencer provides flexibility in that its micro-coded program steps may be changed to correct errors or incorporate improvements to the process steps of an application. Process steps in the programmable sequencer may be added to and/or changed as needed. All devices using such a micro-coded programmable sequencer may be easily updated, thereby simplifying design and support thereof. In addition, fewer such devices may be required since one device may be programmed for many different applications.

Referring now to the drawings, the details of example embodiments are schematically illustrated. Like elements in the drawings will be represented by like numbers, and similar elements will be represented by like numbers with a different lower case letter suffix.

Referring to FIG. 1, depicted are a schematic diagram, a schematic graph of a capacitive voltage divider measurement, e.g., for capacitive touch detection; and a switch timing diagram thereof, according to the teachings of this disclosure. This capacitive voltage divider (CVD) measurement may have a sequence of steps that may comprise a pre-charge phase, an acquisition phase (voltage balance) and a conversion phase. These sequence of steps may typically be performed twice and the two results averaged together for improved noise rejection. For the first sequence of steps the external capacitor may be charged and the sample capacitor discharged. For the subsequent second sequence of steps the external capacitor may be discharged and the sample capacitor may be charged, or visa-versa. The acquisition and conversion phases may be the same for both of these sequence of steps.

FIG. 1(a) shows a schematic diagram of a generalized CVD circuit using an internal sampling capacitor Cb in combination with an analog-to-digital converter (ADC) 102 and a plurality of switches SWa-SWe, e.g., an analog multiplexer. The capacitor Ca is an externally located capacitor to the integrated circuit, e.g., a capacitive touch key. FIG. 1(b) shows the various voltage charge states of the capacitors Ca and Cb. CVD operates on the principle that when connecting together two capacitors of opposite voltage charge the resulting quiescent voltage charge will be the ratio of the two different capacitance values. By knowing one capacitance value, e.g., Cb, the other capacitance value, e.g., Ca, may be determined.

Figure 2:
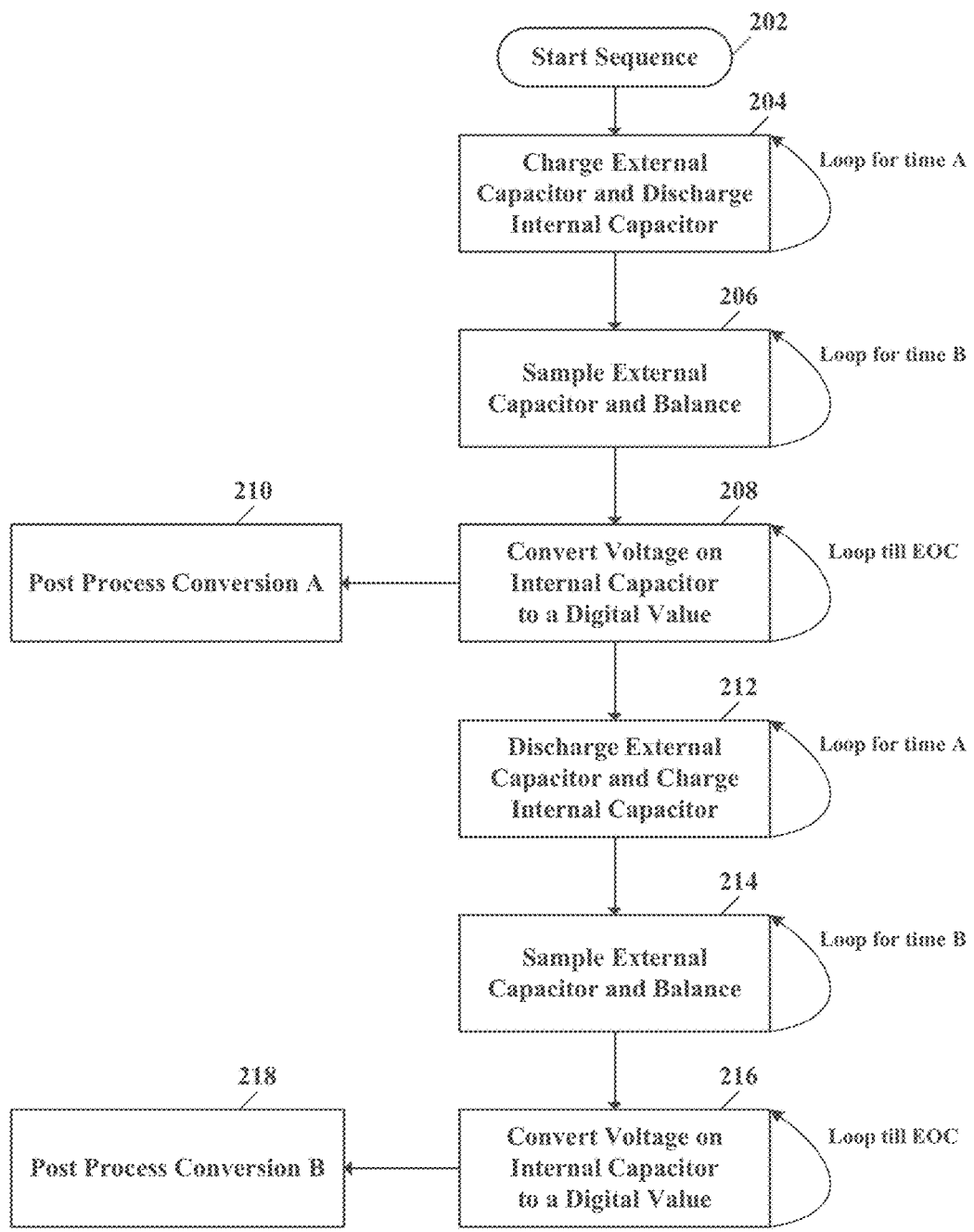
FIG. 2 illustrates a schematic diagram of a flow chart of the sequence of steps shown in FIG. 1, according to specific embodiments of this disclosure.

Referring to FIG. 2, depicted is a flow chart of the sequence of steps shown in FIG. 1, according to specific embodiments of this disclosure. The aforementioned sequence of steps requires access and control of resources such as input-output (I/O) pins, a successive approximation register (SAR) may be used in an analog-to-digital converter (ADC) or a CTMU, multiplexers, a sample and hold circuit, etc. The CVD process starts at step 202. In step 204 the external capacitor Ca is charged to $V_{DD}$, and the internal capacitor Cb is discharged to $V_{SS}$ for a time A. In step 206 the two capacitors Ca and Cb are connected together and their respective charges will equalize (balance) to a voltage between $V_{DD}$ and $V_{SS}$ after a time B. In step 208 this equalized voltage on the internal capacitor Cb is converted to a digital value A (EOC—end of conversion). In step 210 this digital value A is sent to a post process conversion A, as more fully described hereinbelow. In step 212 the external capacitor Ca is discharged to $V_{SS}$, and the internal capacitor Cb is charged to $V_{DD}$ for a time A. In step 214 the two capacitors Ca and Cb are connected together and their respective charges will equalize (balance) to a voltage between $V_{DD}$ and $V_{SS}$ after a time B. In step 216 this equalized voltage on the internal capacitor Cb is converted to a digital value B (EOC—end of conversion). In step 218 this digital value B is sent to a post process conversion B, as more fully described hereinbelow.

Figure 2A:
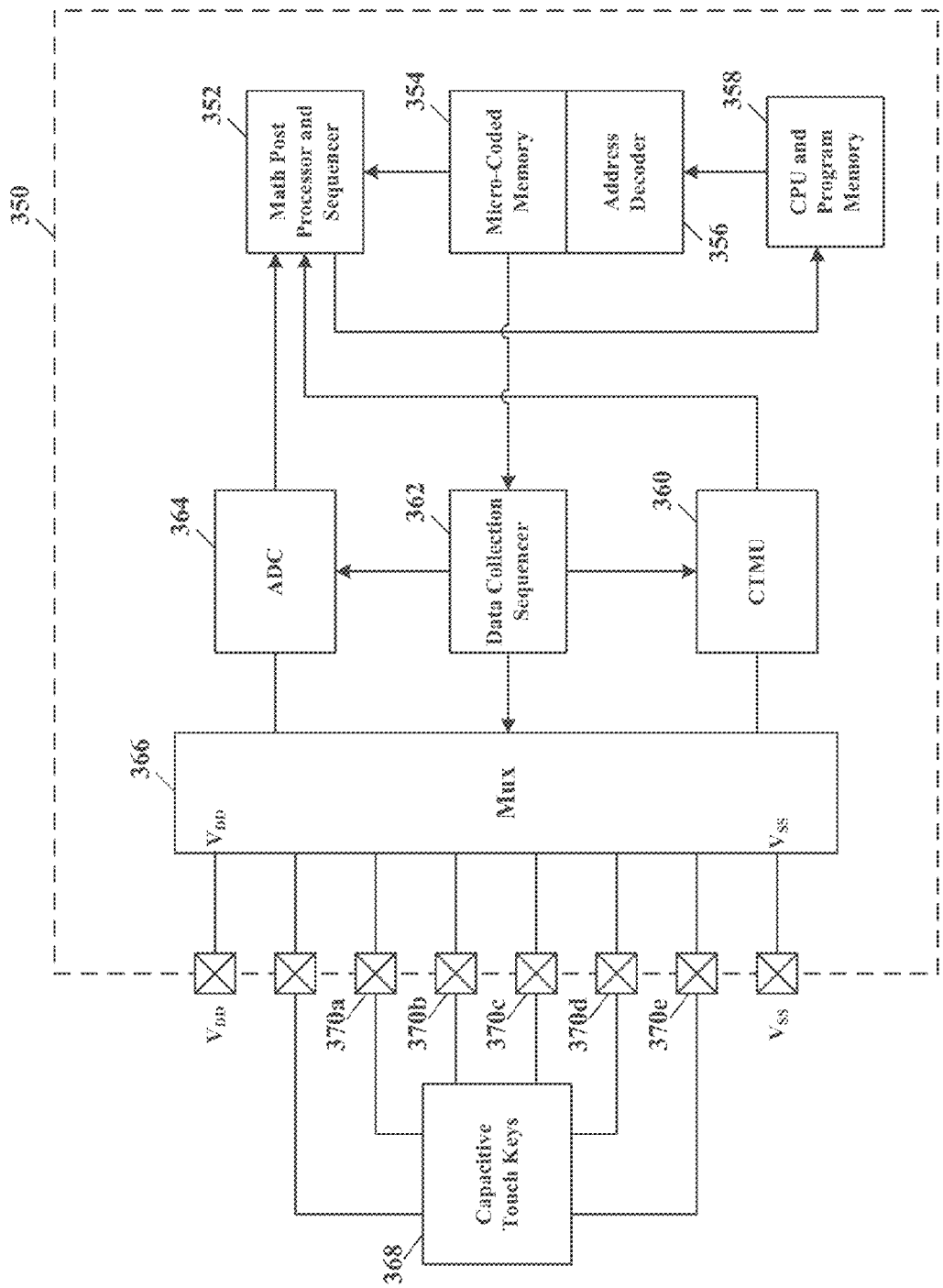
FIG. 2A illustrates a schematic block diagram of a microcontroller, according to specific example embodiments of this disclosure.

Referring to FIG. 2A, depicted is a schematic block diagram of a microcontroller, according to specific example embodiments of this disclosure. A microcontroller 350 may comprise a math post processor and sequencer (MPPS) 352, a micro-coded memory 354, address decoder 356, a CPU and program memory 358, a CTMU 360, a data collection sequencer (DCS) 362, an ADC 364, an analog multiplexer 366, a plurality of external connection nodes 370 that may be used for coupling the microcontroller 350 to capacitive touch keys 368.

The DCS 362 may be controlled with micro-coded words (DCSCW) from the micro-coded memory 354. A DCSCW for each sequence state may be used to instruct the DCS 362 how to control the multiplexer 366, ADC 364 and/or CTMU 360. The MPPS 352 may be controlled with micro-coded words (MPPSCW) from the micro-coded memory 354. A MPPSCW for each computational sequence state may be used to instruct the MPPS 352 on how to process the data from the ADC 364 and/or CTMU 360, then provide a result, when appropriate, to the CPU 358.

The multiplexer 366 may be used to couple the external nodes 370 to either $V_{DD}$, $V_{SS}$, or an input of the ADC 364 or CTMU 360, as described more fully in the discussion of FIGS. 1 and 2 above. The DCS 362, MPPS 352, multiplexer 366 and micro-coded memory 354 may operate independently of the CPU and program memory 358, and may allow the higher power draw modules in the microcontroller 350 to remain in a low power sleep mode until a predefined criteria is met, e.g., capacitance change of a touch key 368 is sufficient to indicate capacitive object in close proximity thereto, e.g., a finger touch (not shown).

Figure 2B:
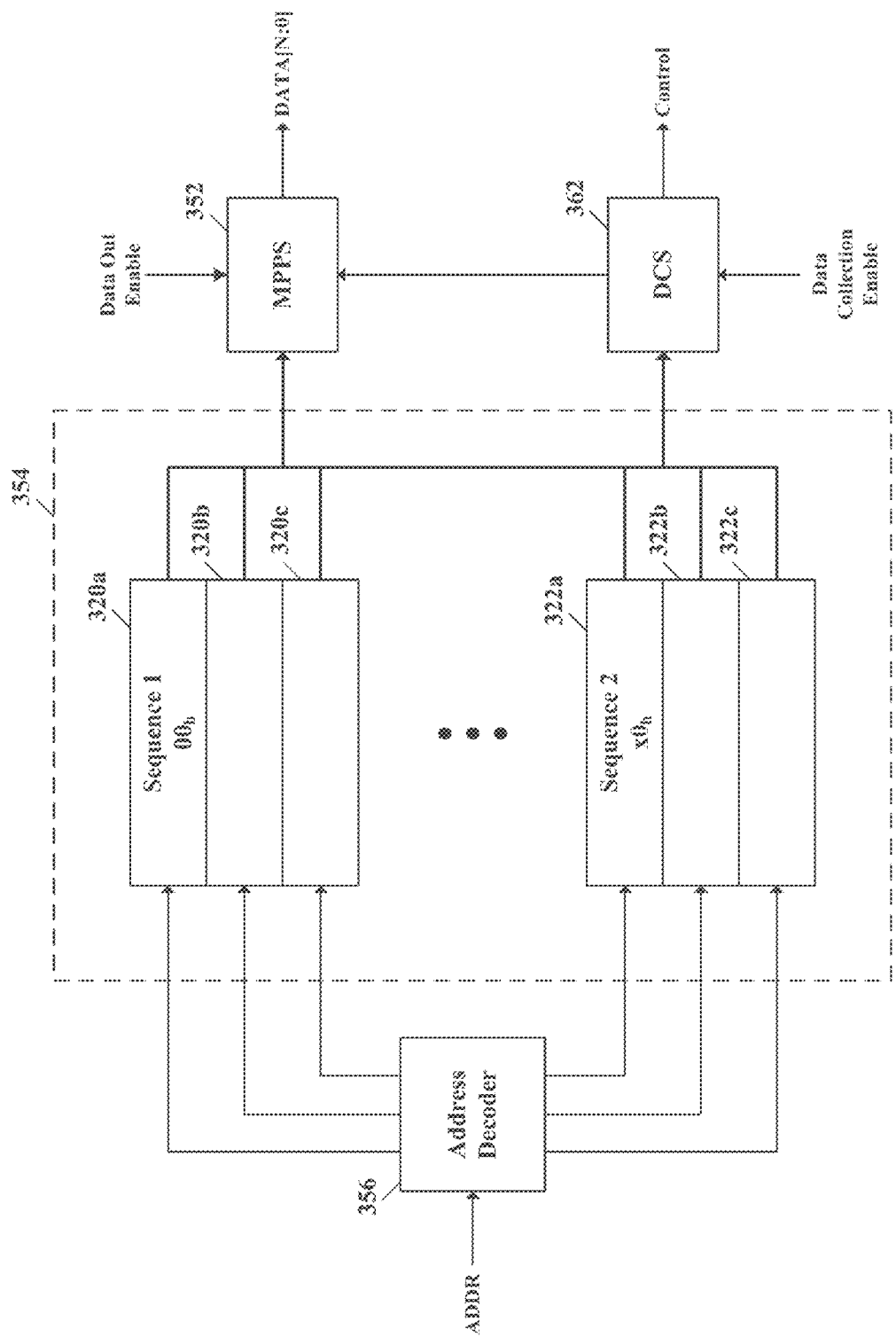
FIG. 2B illustrates a schematic block diagram of a plurality of micro-coded words, according to specific embodiments of this disclosure.

Referring to FIG. 2B, depicted is a schematic block diagram of a plurality of micro-coded words, according to specific embodiments of this disclosure. A first sequence of steps may comprise a plurality of micro-coded words 320, wherein each one of the plurality of micro-coded words 320 represents a step in the associated first sequence. A second sequence of steps may comprise a plurality of micro-coded words 322, wherein each one of the plurality of micro-coded words 322 represents a step in the associated second sequence. An address decoder 356 may control which one of the plurality of micro-coded words 320 or 322 is selected, wherein the micro-coded contents of the selected one of the plurality of micro-coded words 320 or 322 provide the operating instructions for the DCS 362 and the MPPS 352. It is contemplated and within the scope of this disclosure that appropriate micro-coded words 320 and 322 may be selected by the address decoder 356 substantially simultaneously to instruct the MPPS 352 and DCS 362 to control the appropriate functions for pipeline operations thereof.

Figures 3, 6:
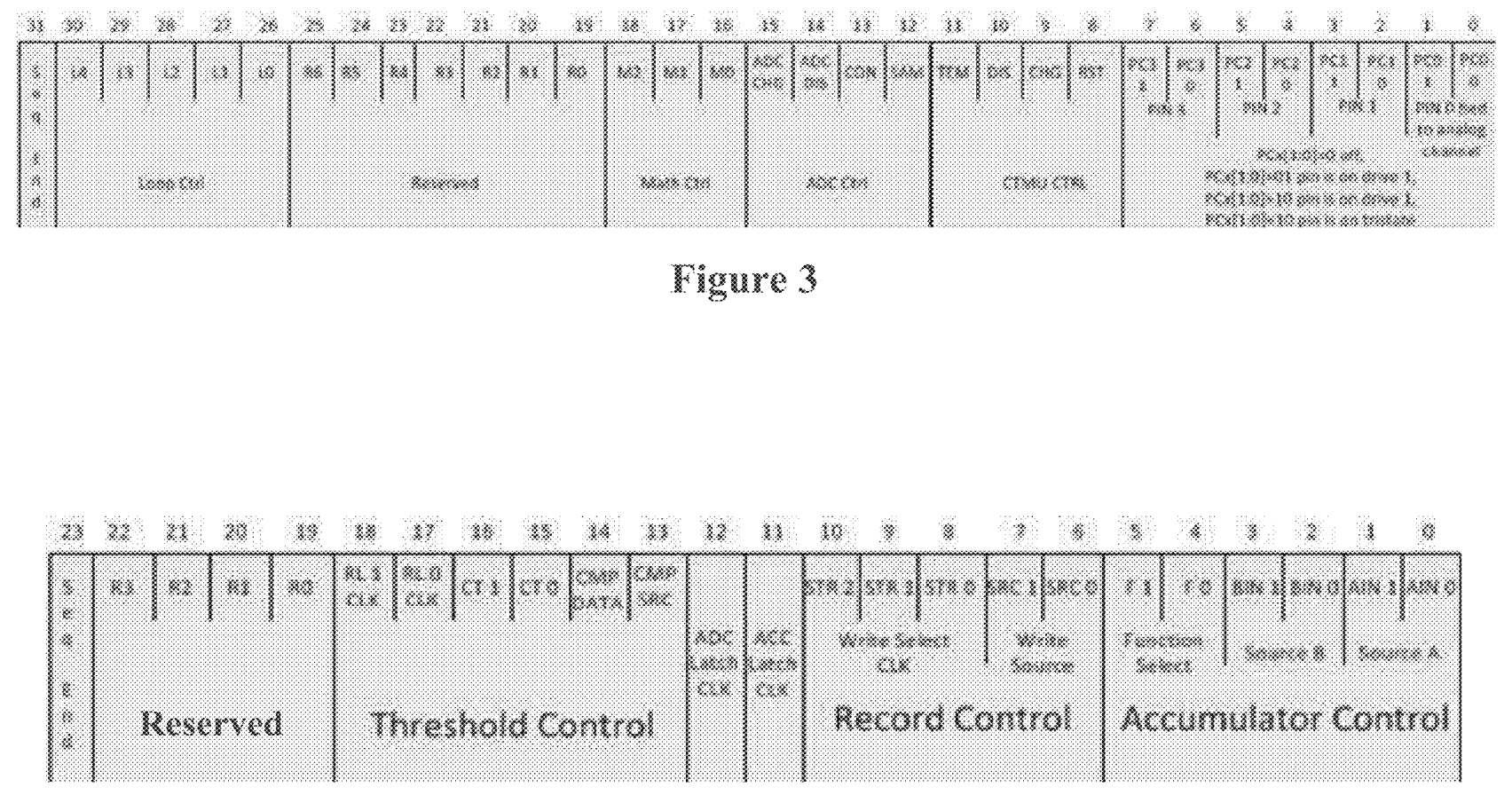

Referring to FIG. 3, depicted is a register bit assignment diagram for a micro-coded word used to control resources needed for the CVD process, according to a specific example embodiment of this disclosure. The micro-coded word may be stored in, for example but is not limited to, one time programming (OTP), Flash memory, random access memory (RAM) volatile and/or non-volatile. Sequences may be added or modified in this architecture, thereby creating an intelligent peripheral that can reduce CPU workload or run when other higher power demand modules, e.g., CPU, are in a sleep mode for conserving power.

The micro-coded word may comprise bitfields for defining one or more loops, control post process conversion math operations, control the various CVD phases, control an ADC 364, control a capacitive time measurement unit (CTMU) 360 and its various operating phases, control the operation of various external nodes 370 (external connections of an integrated circuit package) associated with the peripherals, etc. Starting from a measurement conversion sequence as shown in FIG. 1, a state diagram as shown in FIG. 2 may be formed. Then, a program word is defined for each associated state in the flow diagram. The sequential steps are then stored in a micro-coded memory 354, such as flash memory, RAM, or hard coded into a one-time programmable (OTP) memory.

The micro-coded word shown in FIG. 3 may comprise, for example but is not limited to, 32 bits. Wherein bits [31:26] may be used for loop control, bits [25:19] may be reserved for future use, bits [18:16] may be used for math calculations control, bits [15:12] may be used for ADC control, bits [11:8] may be used for CTMU control, and bits [7:0] may be used for external node connections, e.g., external connection pins on a microcontroller integrated circuit package.

The programmable sequencers, DCS 362 and/or MPPS 352, may comprise state machines that have access to respective special function registers of modules (peripherals) of a device for controlling their associated functions. A state machine can be implemented that is controlled by the micro-coded words 320 and 322. As only certain functions are needed, the state machine may be designed with a minimum of associated logic to keep its logic device footprint small on an integrated circuit silicon die.

Figure 4:
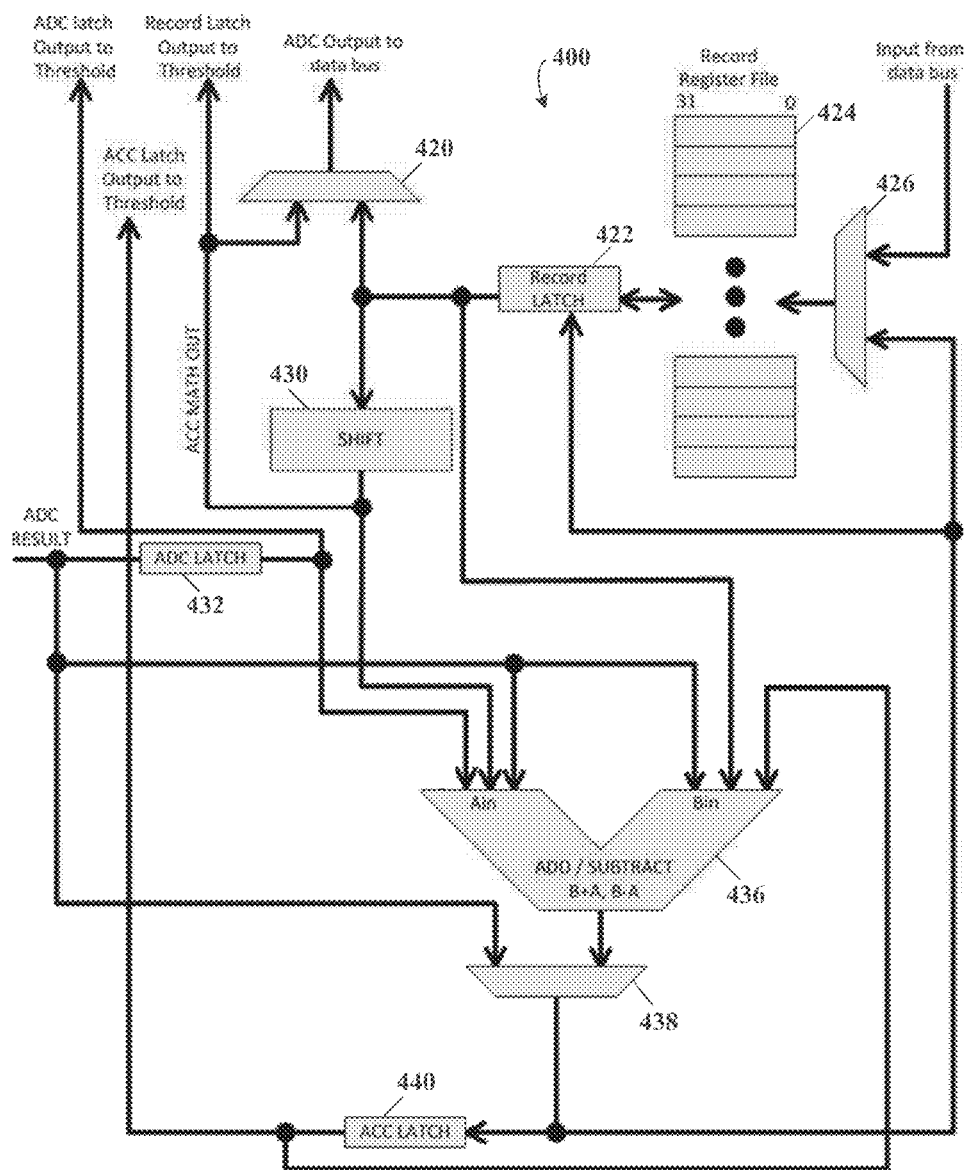
FIG. 4 illustrates a schematic block diagram of data accumulation and processing logic, according to specific example embodiments of this disclosure.

Referring now to FIG. 4, depicted is a schematic block diagram of data accumulation and processing logic, according to specific example embodiments of this disclosure. The data accumulation and processing logic, generally represented by the numeral 400, may comprise a first multiplexer 420, a record latch 422, a record file 424, a second multiplexer 426, a shift register 430, an ADC latch 432, add/subtract logic 436, a third multiplexer 438, and an accumulator latch 440. All of the aforementioned logic may be used in the state machine configurations and controlled by the micro-coded words 320 and/or 322.

Figure 5:
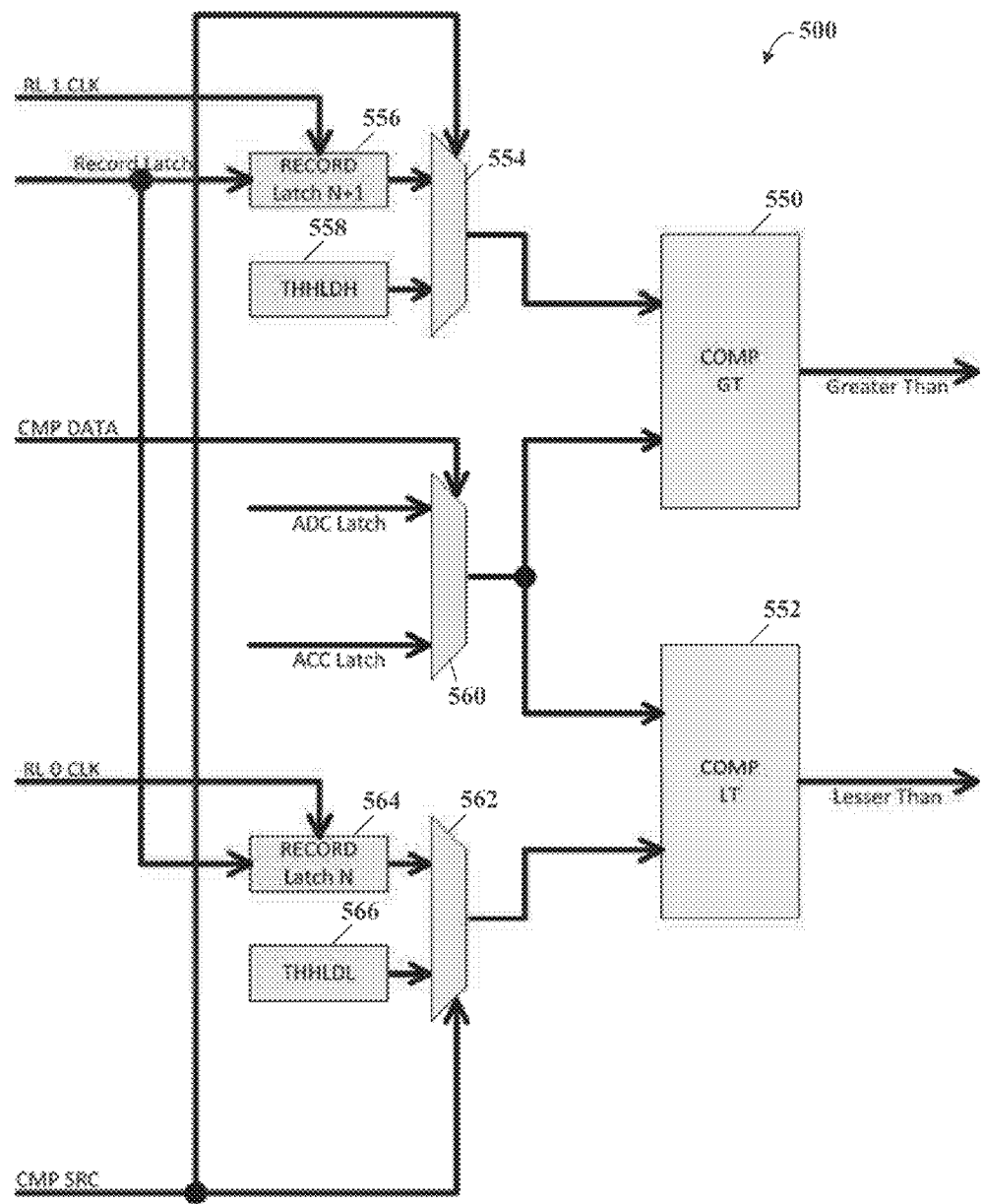
FIG. 5 illustrates a schematic block diagram of data comparison logic, according to specific example embodiments of this disclosure.

Referring now to FIG. 5, depicted is a schematic block diagram of data comparison logic, according to specific example embodiments of this disclosure. The data comparison logic, generally represented by the numeral 500, may comprise a "greater than" comparator 550, a "less than" comparator 552, a fourth multiplexer 554, a fifth multiplexer 560, a sixth multiplexer 562, a N+1 record latch 556, a high threshold latch (THHLDH) 558, an N record latch 564, and a low threshold latch (THHLDL) 566.

Math processing may be provided as shown in FIGS. 4 and 5. Math processing may be defined by using one or more separate micro-coded word(s) that may be linked to the MPPS 352 computation sequence control. The respective micro-coded word as shown in FIG. 6 allows for performing a math operation using an associated arithmetic logic unit as shown in FIG. 4 and comparison operations as shown in FIG. 5. Adding or subtracting may be performed and various input signals for the respective operation being performed may be selected. Threshold registers allow for comparison with upper and lower thresholds and generate associated signals as shown in FIG. 5.

Referring now to FIG. 6, depicted is a register bit assignment diagram for a micro-coded word used to control resources needed for math post processing, according to a specific example embodiment of this disclosure. The math post processing may be accomplished by first defining the various states of the post processing and create an associated state diagram. Subsequently, a program word may be defined for each state using a micro-coded word, for example but not limited to, what is shown in FIG. 6. The micro-coded word shown in FIG. 6 may comprise, for example but is not limited to, 24 bits. Wherein bit [23] may indicate the end of a sequence, bits [22:19] may be reserved for future use, bits [18:13] may be used for threshold control, bit [12] may be used for the ADC latch clock, bit [11] may be used for the ACC (accumulator) latch clock, bits [10:6] may be used for record control, and bits [5:0] may be used for accumulator control. Each micro-coded word may be stored in flash or DRAM or may be hard coded in an OTP memory similar to the sequencer control.

The resulting micro-coded sequencer peripheral provides for the following benefits: It is configurable for greater flexibility, it allows easily recovery from errors, it allows for easier inclusion of new process steps. Predefined sequences may be provided by canned codes that can be created and made available for users for a plurality of predefined applications. However, the device would of course also allow users to create their own custom process steps. This micro-coded sequencer peripheral is able to operate independently of the CPU.

The invention claimed is:

1. An apparatus for analog-to-digital conversion using a micro-coded sequencer, comprising:
   means for analog-to-digital conversion;
   a micro-coded sequencer coupled to and configured to control the analog-to-digital conversion means;
   an address decoder coupled to the memory and operable to select a micro-coded word for the micro-coded sequencer; and
   a memory coupled to the micro-coded sequencer, wherein the memory is configured to store micro-coded words for instructing the micro-coded sequencer how to control the analog-to-digital conversion means.

2. The apparatus according to claim 1, wherein the analog-to-digital conversion means is an analog-to-digital converter (ADC).

3. The apparatus according to claim 1, wherein the analog-to-digital conversion means is a charge time measurement unit (CTMU).

4. The apparatus according to claim 1, further comprising an analog multiplexer having an output coupled to an input of the analog-to-digital conversion means and controlled by the micro-coded sequencer, wherein the analog multiplexer selects inputs thereof determined by the micro-coded words instructing the micro-coded sequencer.

5. The apparatus according to claim 1, wherein the micro-coded word comprises portions selected from the group consisting of loop control, math calculations control, analog-to-digital conversion control, charge time measurement unit control, and control of external node connections.

6. The apparatus according to claim 1, wherein the micro-coded word comprises portions selected from the group consisting of end of sequence, threshold control, analog-to-digital conversion latch clock, accumulator latch clock, record control and accumulator control.

7. An apparatus for analog-to-digital conversion using a micro-coded sequencer, comprising:
   means for analog-to-digital conversion;
   a micro-coded sequencer coupled to and configured to control the analog-to-digital conversion means;
   an address decoder coupled to the memory and operable to select a micro-coded word for the micro-coded sequencer;
   a memory coupled to the micro-coded sequencer, wherein the memory is configured to store micro-coded words for instructing the micro-coded sequencer how to control the analog-to-digital conversion means; and
   a central processing unit (CPU) having a low power sleep mode, wherein the micro-coded sequencer, analog-to-digital conversion means and memory function when the CPU is in the low power sleep mode.

8. The apparatus according to claim 7, wherein the CPU, micro-coded sequencer, analog-to-digital conversion means and the memory are provided by a microcontroller.

9. An apparatus for analog-to-digital conversion using a micro-coded sequencer, comprising:
   means for analog-to-digital conversion;
   a micro-coded sequencer coupled to and configured to control the analog-to-digital conversion means;
   an address decoder coupled to the memory and operable to select a micro-coded word for the micro-coded sequencer; and
   a memory coupled to the micro-coded sequencer, wherein the memory is configured to store micro-coded words for instructing the micro-coded sequencer how to control the analog-to-digital conversion means;
   wherein the micro-coded sequencer comprises a data collection sequencer and a math post processor sequencer.

10. The apparatus according to claim 9, further comprising a math post processor, wherein the math post processor is controlled by the math post processor sequencer.

11. The apparatus according to claim 9, wherein each of the micro-coded words comprises a data portion and a math post processor portion.

12. The apparatus according to claim 9, wherein a first plurality of micro-coded words are operable to control the data collection sequencer and a second plurality of micro-coded words controls the math post processor sequencer.

13. An apparatus for analog-to-digital conversion using a micro-coded sequencer, comprising:
   means for analog-to-digital conversion;
   a micro-coded sequencer coupled to and configured to control the analog-to-digital conversion means;
   an address decoder coupled to the memory and operable to select a micro-coded word for the micro-coded sequencer; and
   a memory coupled to the micro-coded sequencer, wherein the memory is configured to store micro-coded words for instructing the micro-coded sequencer how to control the analog-to-digital conversion means;
   wherein a first plurality of micro-coded words are operable to control a first sequence of steps and a second plurality of micro-coded words controls a second sequence of steps.

14. An analog-to-digital converter peripheral in an integrated circuit device, comprising:
   an analog-to-digital converter (ADC) core;
   a state machine controlled by programmable instruction words, wherein the state machine is configured to perform control functions of the ADC core and is operable to at least configure external pins of the integrated circuit device, initiate sampling and conversion, store results in a memory, and perform loop operations;
   a memory for storing a sequence of associated instruction words; and
   an arithmetic logic unit controllable by at least one post processing instruction word, wherein post processing is initiated by the state machine instruction word.

15. The ADC peripheral according to claim 14, wherein an instruction word comprises bit fields for defining at least one of: a loop, a post processing function, an ADC control function, and an external pin configuration.

16. The ADC peripheral according to claim 15, further comprising a capacitive time measurement unit (CTMU) and wherein the instruction word comprises a bit field for control of the CTMU.

17. The ADC peripheral according to claim 14, wherein the post processing instruction word comprises at least one bit field for controlling a threshold, an accumulator input, and storing of results.

18. A microcontroller comprising:
   an integrated circuit; and
   an analog-to-digital converter peripheral of the integrated circuit, comprising:
      an analog-to-digital converter (ADC) core;
      a state machine controlled by programmable instruction words, wherein the state machine is configured to control functions of the ADC core and is operable to at least configure external pins of the integrated circuit device, initiate sampling and conversion, store results in a memory, and perform loop operations;
      a memory for storing a sequence of associated instruction words; and
      an arithmetic logic unit controllable by at least one post processing instruction word, wherein post processing is initiated by the state machine instruction word.

19. The microcontroller according to claim 18, wherein an instruction word comprises bit fields for defining at least one of: a loop, a post processing function, an ADC control function, and an external pin configuration.

20. The microcontroller according to claim 18, further comprising a capacitive time measurement unit (CTMU) and wherein the instruction word comprises a bit field for control of the CTMU.

21. The microcontroller according to claim 18, wherein the post processing instruction word comprises at least one bit field for controlling a threshold, an accumulator input, and storing of results.

* * * * *